(12) United States Patent (10) Patent No.: US 12,652,013 B2

Wu (45) Date of Patent: Jun. 9, 2026

(54) NOISE REDUCTION SIGNAL GENERATOR

(71) Applicant: ALi Corporation, Hsinchu (TW)

(72) Inventor: Wei Yang Wu, Guangdong (CN)

(73) Assignee: ALi Corporation, Hsinchu (TW)

( * ) Notice: Subject to any disclaimer, the term of this patent is extended or adjusted under 35 U.S.C. 154(b) by 61 days.

(21) Appl. No.: 18/641,437

(22) Filed: Apr. 22, 2024

(65) Prior Publication Data

US 2024/0388272 A1 Nov. 21, 2024

(30) Foreign Application Priority Data

May 17, 2023 (CN) .......................... 202310556504.0

(51) Int. Cl.
| | |
|---|---|
| *H03H 7/01* | (2006.01) |
| *H03K 5/24* | (2006.01) |
| *H03K 17/687* | (2006.01) |

(52) U.S. Cl.
CPC .............. *H03H 7/0115* (2013.01); *H03K 5/24* (2013.01); *H03K 17/6874* (2013.01)

(58) Field of Classification Search
CPC .......... H03K 7/08; H03K 5/24; H03K 5/1252; H03K 9/08; H03K 3/017; H03K 17/6874; H03M 1/822; H03H 7/0115
See application file for complete search history.

(56) References Cited

U.S. PATENT DOCUMENTS 7,816,982 B2 * 10/2010 Wu ....................... H03F 3/2173
330/10

FOREIGN PATENT DOCUMENTS

| | | | |
|---|---|---|---|
| CN | 106535022 | 3/2017 | |
| CN | 107612528 A * | 1/2018 | ......... H03K 19/0948 |

OTHER PUBLICATIONS

BLOG CSDN, "A detailed explanation of how Class D amplifiers work", Oct. 5, 2021, with English translation thereof, pp. 1-11. Available at: https://blog.csdn.net/qq_40966696/article/details/120339477.

* cited by examiner

*Primary Examiner* — Lincoln D Donovan
*Assistant Examiner* — James G Yeaman
(74) *Attorney, Agent, or Firm* — JCIPRNET

(57) ABSTRACT

A noise reduction signal generator is provided. The noise reduction signal generator includes a comparator, a conversion circuit, and a low pass filter circuit. The comparator receives an input signal and a reference signal and compares the input signal and the reference signal to generate a first pulse width modulation (PWM) signal. A pulse width of the first PWM signal is correlated to a comparison result between a signal intensity of the input signal and a signal intensity of the reference signal. The conversion circuit converts the first PWM signal to a second PWM signal. A phase of the second PWM signal is different from a phase of the first PWM signal. The low pass filter circuit performs a filtering operation on the second PWM signal to generate a noise inversion signal. The noise inversion signal is configured to reduce noise of the input signal.

9 Claims, 8 Drawing Sheets

350'

NOISE REDUCTION SIGNAL GENERATOR

CROSS-REFERENCE TO RELATED APPLICATION

This application claims the priority benefit of China application serial no. 202310556504.0, filed on May 17, 2023. The entirety of the above-mentioned patent application is hereby incorporated by reference herein and made a part of this specification.

BACKGROUND

Technical Field

The disclosure relates to a signal generator; more particularly, the disclosure relates to a noise reduction signal generator configured to reduce noise.

Description of Related Art

In general, existing devices (such as headphones, vehicle suspension systems, precision workstations, and so on) are required to have low noise output. To enhance the signal output quality and/or stability while using the devices, it is necessary for the devices to filter out noise from the signals. Hence, professionals in the field are actively researching ways to equip these devices with active noise reduction mechanisms or circuits, which is a key area of focus.

SUMMARY

The disclosure provides a noise reduction signal generator that is configured to reduce noise and allows a device equipped with the noise reduction signal generator to have an active noise reduction mechanism.

According to an embodiment of the disclosure, a noise reduction signal generator including a comparator, a conversion circuit, and a low pass filter circuit is provided. The comparator is configured to receive an input signal and a reference signal and compare the input signal and the reference signal to generate a first pulse width modulation (PWM) signal, where a pulse width of the first PWM signal is correlated to a comparison result of a signal intensity of the input signal and a signal intensity of the reference signal. The conversion circuit is coupled to the comparator and converts the first PWM signal to a second PWM signal, where a phase of the second PWM signal is different from a phase of the first PWM signal. The low pass filter circuit is coupled to the conversion circuit and configured to perform a filtering operation on the second PWM signal to generate a noise inversion signal. The noise inversion signal is configured to reduce noise of the input signal.

In view of the above, the noise reduction signal generator generates the noise inversion signal according to the input signal, and the noise inversion signal is configured to reduce the noise of the input signal. As such, as long as the input signal is received, the noise reduction signal generator actively generates the noise inversion signal to reduce the noise of the input signal; namely, the noise reduction signal generator provides the active noise reduction mechanism.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
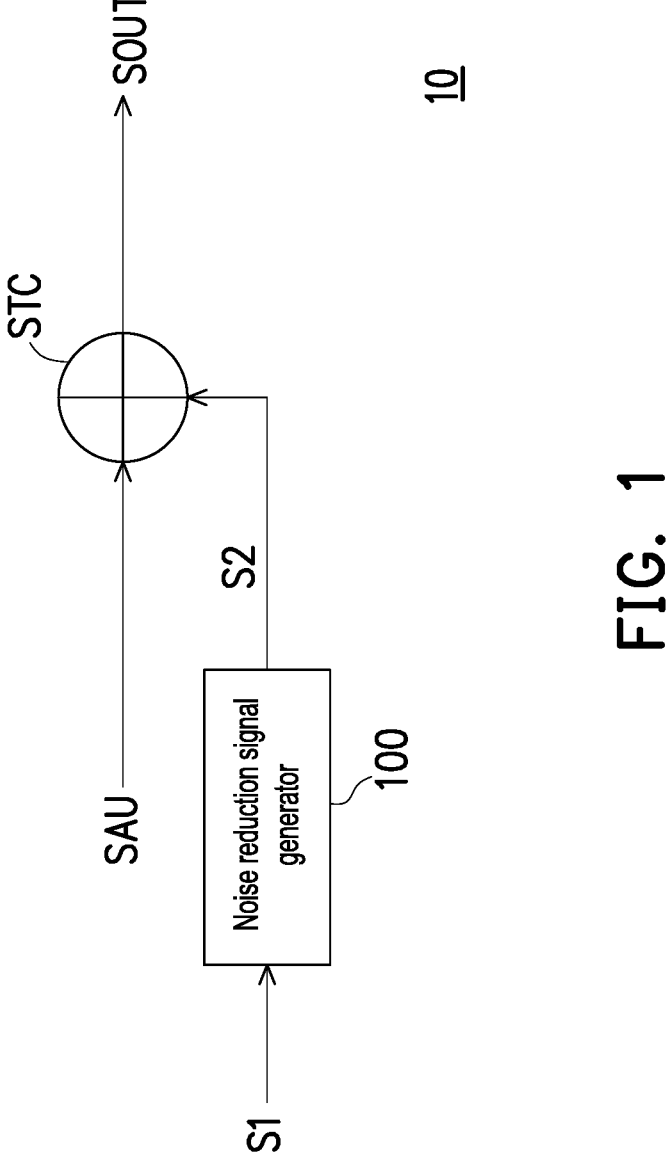
FIG. 1 is a schematic view of a device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like parts.

Please refer to FIG. 1, which is a schematic view of a device according to an embodiment of the disclosure. In this embodiment, a device 10 may be a headphone, a loudspeaker, a vehicle suspension system, a magnetic levitation precision workstation, a handheld stabilizer, a shock-absorbing seat for heavy vehicles, and so forth. For illustrative purposes, the device 10 provided in this embodiment as shown in FIG. 1 merely includes circuits in association with an active noise reduction mechanism. The device 10 outputs an output signal SOUT according to a signal SAU. To be specific, to actively reduce the noise, the device 10 reduces or filters out a noise source in the signal SAU to generate the output signal SOUT.

In this embodiment, the device 10 includes a noise reduction signal generator 100 and a synthesized circuit STC. The noise reduction signal generator 100 receives an input signal S1. The noise reduction signal generator 100 converts the input signal S1 to a noise inversion signal S2. The synthesized circuit STC is coupled to the noise reduction signal generator 100. The synthesized circuit STC receives the signal SAU and the noise inversion signal S2. The synthesized circuit STC synthesizes the signal SAU and the noise inversion signal S2 to generate the output signal SOUT. In this embodiment, the synthesized circuit STC may be implemented by an adder circuit.

For instance, the input signal S1 is the noise source in the signal SAU. If the signal SAU is an audio signal, the input signal S1 may be ambient noise. Hence, the output signal SOUT may be a signal with low ambient noise. In another example, if the signal SAU is noise signal, the input signal S1 is substantially the same as the signal SAU. Hence, an intensity of the output signal SOUT is reduced.

Figure 2:
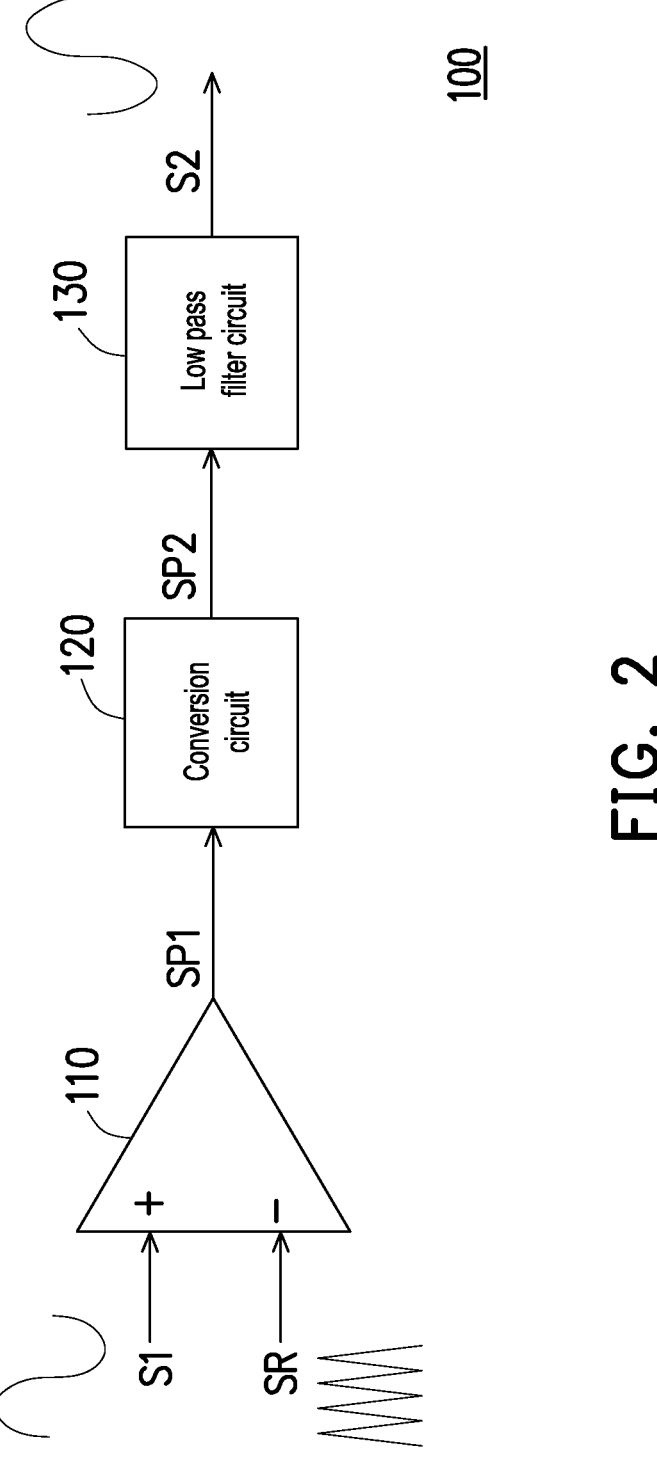
FIG. 2 is a schematic view of a noise reduction signal generator according to a first embodiment of the disclosure.

Please refer to FIG. 2, which is a schematic view of a noise reduction signal generator according to a first embodiment of the disclosure. In this embodiment, the noise reduction signal generator 100 includes a comparator 110, a conversion circuit 120, and a low pass filter circuit 130. The comparator 110 receives the input signal S1 and a reference signal SR. The comparator 110 compares the input signal S1 and the reference signal SR to generate a pulse width modulation (PWM) signal SP1. In this embodiment, a pulse width of the PWM signal SP1 is correlated to a comparison result of a signal intensity of the input signal S1 and a signal intensity of the reference signal SR. The signal intensity may be a voltage value, a signal amplitude, and so on. The comparison result is a difference between a peak value of the input signal S1 and a peak value of the reference signal SR or a difference between a valley value of the input signal S1 and a valley value of the reference signal SR. For instance, when the signal intensity of the input signal S1 and the signal intensity of the reference signal SR are compared, a range of the input signal S1 may be between the peak value of the reference signal SR and the valley value of the reference signal SR.

In this embodiment, the input signal S1 is any analog signal. For instance, the reference signal SR is a cycle signal. If the input signal S1 is the cycle signal, a cycle of the reference signal SR is shorter than a cycle of the input signal S1. The reference signal SR may be a high frequency signal. In this embodiment, the reference signal SR may be a triangular wave signal or a sawtooth wave signal. The implementation manner of the reference signal SR should not be construed as a limitation in the disclosure. In some embodiments, the reference signal SR is, for instance, a sine wave or a trapezoidal wave with a fixed cycle.

In this embodiment, the conversion circuit 120 is coupled to the comparator 110. The conversion circuit 120 converts the PWM signal SP1 to a PWM signal SP2. A phase of the PWM signal SP2 is different from a phase of the PWM signal SP1. The low pass filter circuit 130 is coupled to the conversion circuit 120. The low pass filter circuit 130 performs a filtering operation on the PWM signal SP2 to generate the noise inversion signal S2. The noise inversion signal S2 is configured to reduce the noise of the input signal S1.

It is worth mentioning that the noise reduction signal generator 100 generates the noise inversion signal S2 according to the input signal S1. The noise inversion signal S2 is configured to reduce the noise of the input signal S1. Thereby, as long as the input signal S1 is received, the noise reduction signal generator 100 may actively generate the noise inversion signal S2 to reduce the noise in the input signal S1. Accordingly, the noise reduction signal generator 100 provides the active noise reduction mechanism.

Figure 3:
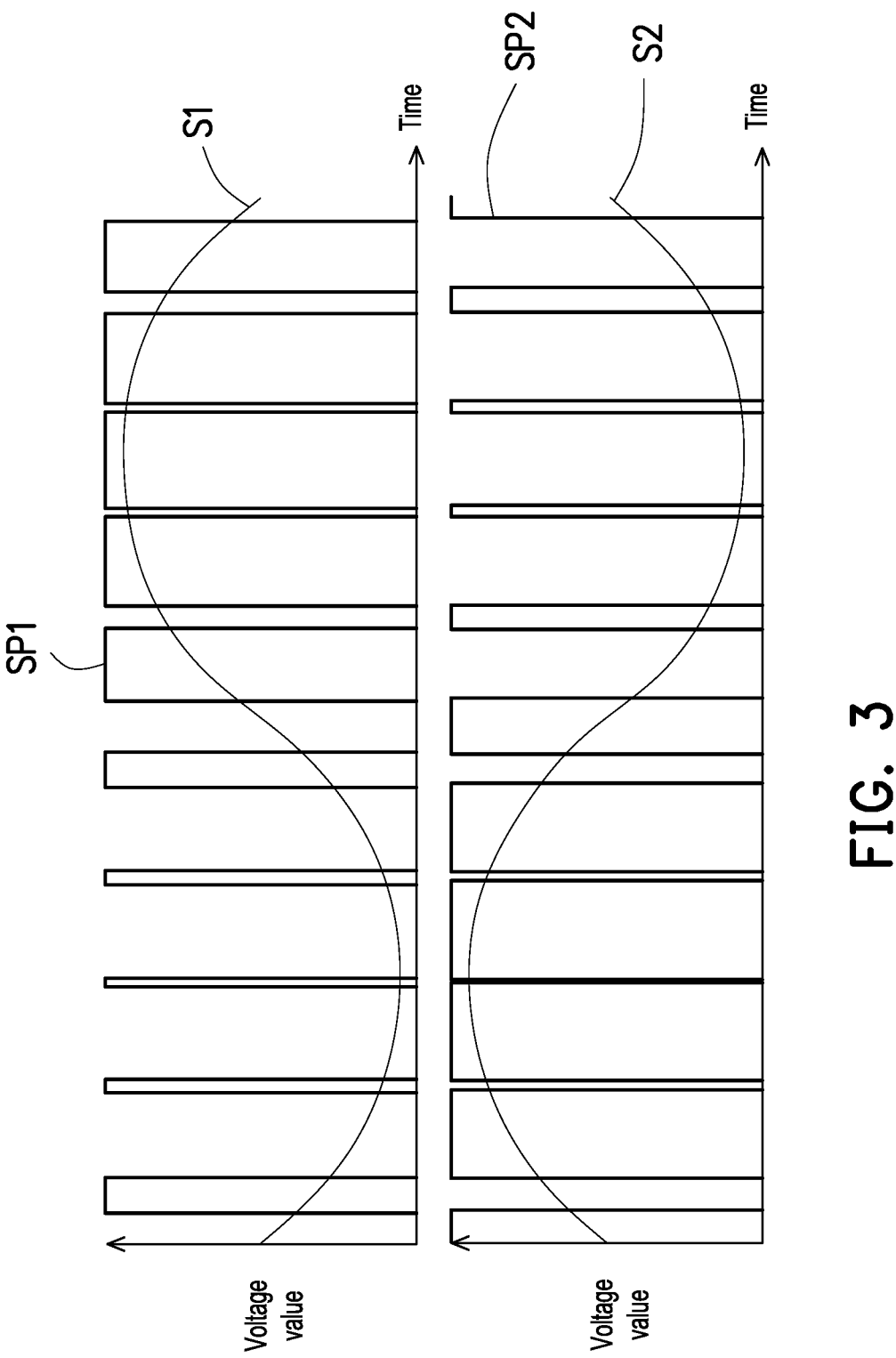
FIG. 3 is a waveform diagram illustrating an input signal, pulse width modulation (PWM) signals, and a noise inversion signal according to an embodiment of the disclosure.

Please refer to FIG. 2 and FIG. 3. FIG. 3 is a waveform diagram illustrating an input signal, PWM signals, and a noise inversion signal according to an embodiment of the disclosure. FIG. 3 shows waveforms of the input signal S1, the PWM signals SP1 and SP2, and the noise inversion signal S2. A non-inverted input terminal of the comparator 110 receives the input signal S1. An inverted input terminal of the comparator 110 receives the reference signal SR. Optionally, as long as the internal mechanism of the noise reduction signal generator may be applied to generate the noise inversion signal to reduce the noise in the input signal, the non-inverted input terminal of the comparator 110 may receive the reference signal SR, and the inverted input terminal of the comparator 110 may receive the input signal S1. An output terminal of the comparator 110 is configured to output the PWM signal SP1. When a voltage value of the input signal S1 is greater than a voltage value of the reference signal SR, the PWM signal SP1 output by the comparator 110 has a high voltage value; when the voltage value of the input signal S1 is smaller than the voltage value of the reference signal SR, the PWM signal SP1 output by the comparator 110 has a low voltage value. The peak value of the reference signal SR remains unchanged. Hence, the higher the voltage value of the input signal S1, the wider the pulse width of the PWM signal SP1. The lower the voltage value of the input signal S1, the narrower the pulse width of the PWM signal SP1.

In this embodiment, the PWM signal SP2 generated by the conversion circuit 120 is inverted to the PWM signal SP1. That is, when the PWM signal SP1 has a low voltage value, the PWM signal SP2 has a high voltage value. On the other hand, when the PWM signal SP2 has a low voltage value, the PWM signal SP1 has a high voltage value.

In this embodiment, the low pass filter circuit 130 determines the voltage value or an amplitude of the noise inversion signal S2 according to the pulse width of the PWM signal SP2. The wider the pulse width of the PWM signal SP2, the higher the voltage value of the noise inversion signal S2. The narrower the pulse width of the PWM signal SP2 is, the lower the voltage value of the noise inversion signal S2. Hence, in this embodiment, the phase of the PWM signal SP2 is opposite to the phase of the PWM signal SP1.

Figure 4:
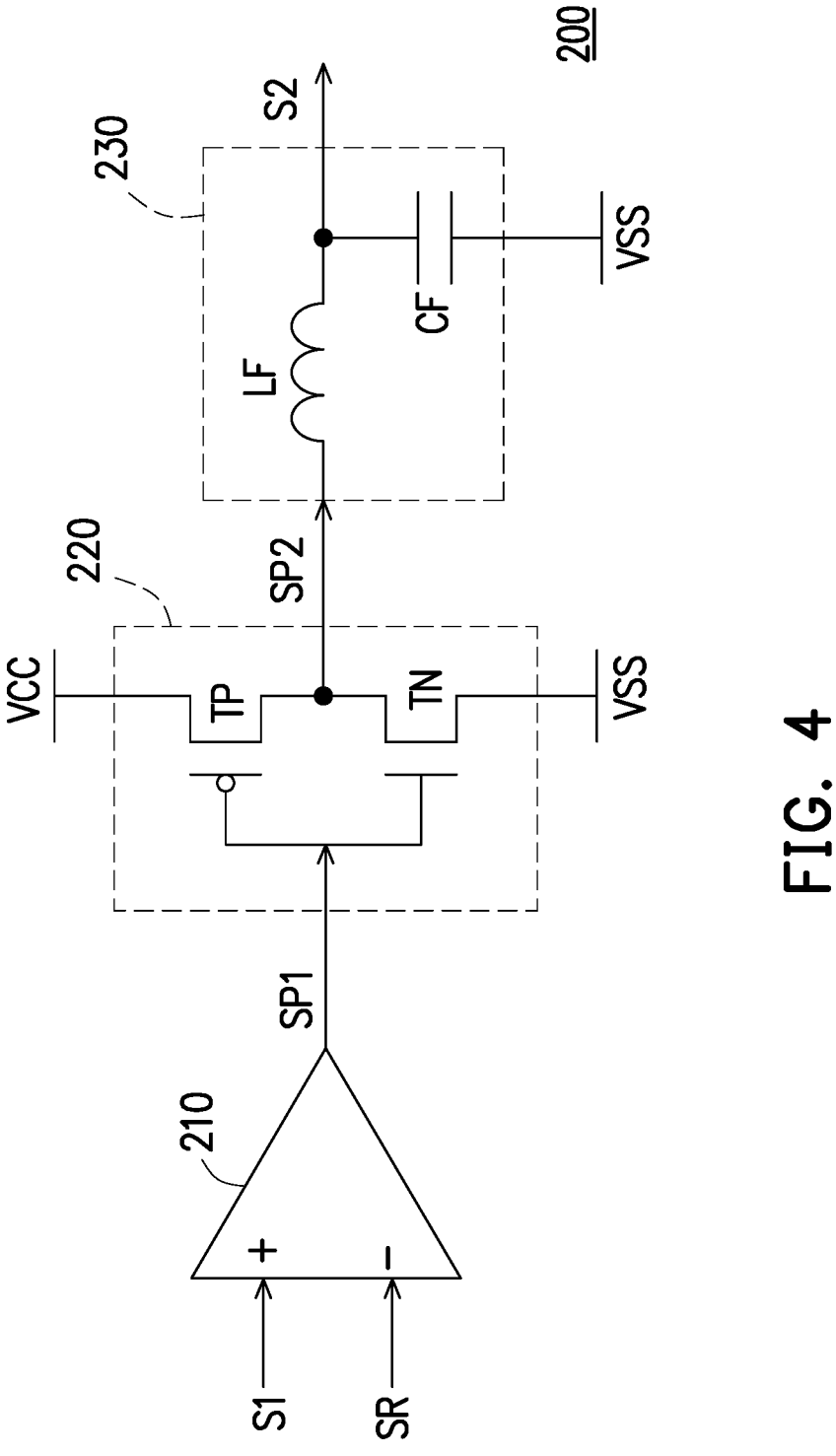
FIG. 4 is a schematic view of a circuit of a noise reduction signal generator according to an embodiment of the disclosure.

Please refer to FIG. 4. FIG. 4 is a schematic view of a circuit of a noise reduction signal generator according to an embodiment of the disclosure. In this embodiment, a noise reduction signal generator 200 includes a comparator 210, a conversion circuit 220, and a low pass filter circuit 230. The implementation manner of the comparator 210 is similar to the implementation manner of the comparator 110 and thus will not be repeated hereinafter. In this embodiment, the conversion circuit 220 is implemented in form of a complementary metal-oxide-semiconductor (CMOS) component. The conversion circuit 220 includes transistors TP and TN. A first terminal of the transistor TP receives a reference high voltage VCC. A second terminal of the transistor TP is coupled to the low pass filter circuit 230. The second terminal of the transistor TP is configured to output the PWM signal SP2. A control terminal of the transistor TP receives the PWM signal SP1 from the comparator 210. A first terminal of the transistor TN is coupled to the second terminal of the transistor TP. A second terminal of the transistor TN receives a reference low voltage VSS. A control terminal of the transistor TN receives the PWM signal SP1 from the comparator 210.

In this embodiment, when the PWM signal SP1 has a low voltage value, the transistor TP is turned on, and the transistor TN is turned off. Hence, a voltage value of the PWM signal SP2 is substantially equal to a voltage value of the reference high voltage VCC. On the other hand, when the PWM signal SP1 has a high voltage value, the transistor TN is turned on, and the transistor TP is turned off. Hence, the voltage value of the PWM signal SP2 is substantially equal to a voltage value of the reference low voltage VSS.

In this embodiment, the low pass filter circuit 230 includes an inductor LF and a capacitor CF. The inductor LF is coupled between the conversion circuit 220 and an output terminal of the noise reduction signal generator 200. The capacitor CF is coupled between the output terminal of the noise reduction signal generator 200 and the reference low voltage VSS. The low pass filter circuit 230 charges the capacitor CF based on the pulse width and the amplitude (the high voltage value) of the PWM signal SP2.

In this embodiment, the wider the pulse width of the PWM signal SP2, the higher the voltage value of the noise inversion signal S2. The narrower the pulse width of the PWM signal SP2, the lower the voltage value of the noise inversion signal S2. In addition, the higher the amplitude of the PWM signal SP2, the higher the voltage value of the noise inversion signal S2. The lower the amplitude of the PWM signal SP2, the lower the voltage value of the noise inversion signal S2.

Figure 5:
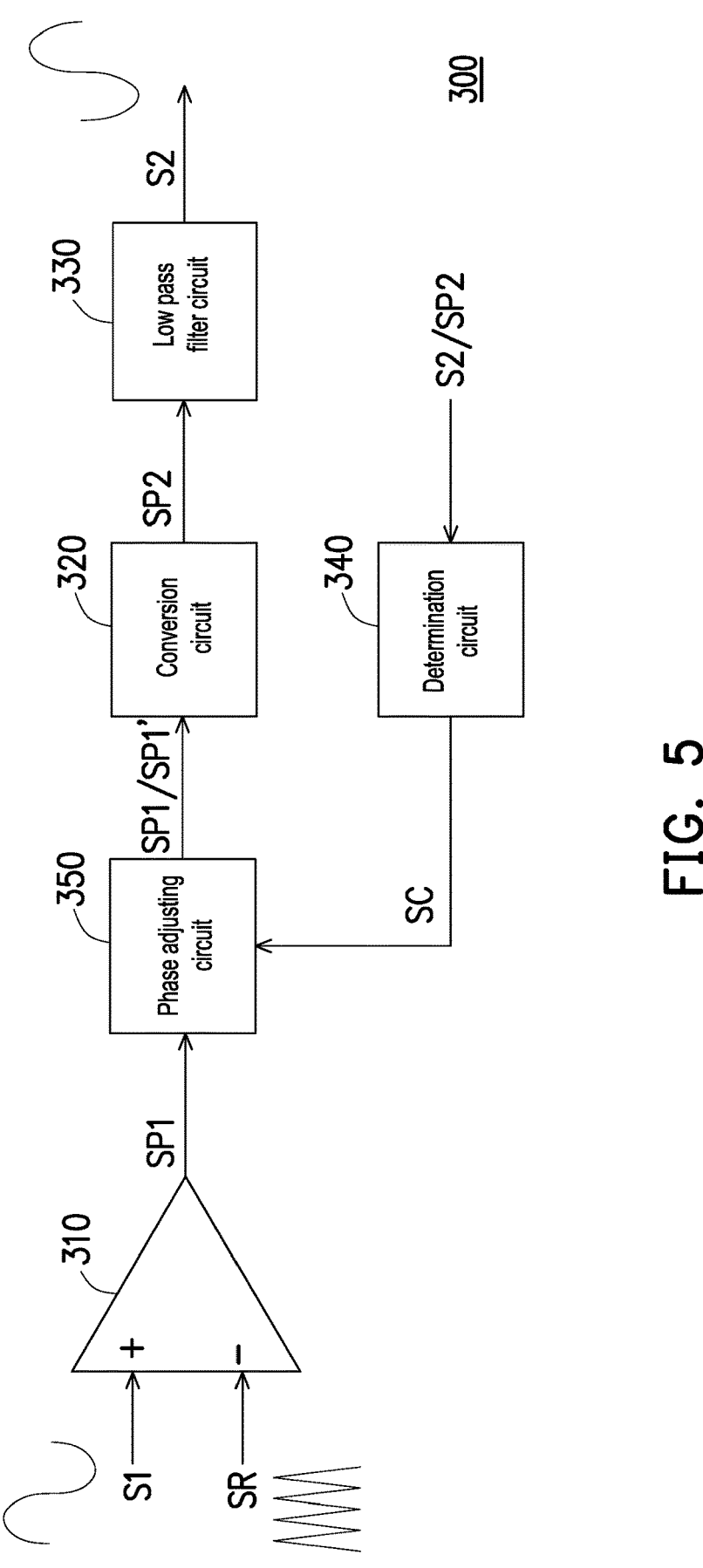
FIG. 5 is a schematic view of a noise reduction signal generator according to a second embodiment of the disclosure.

Please refer to FIG. 5. FIG. 5 is a schematic view of a noise reduction signal generator according to a second embodiment of the disclosure. In this embodiment, a noise reduction signal generator 300 includes a comparator 310, a conversion circuit 320, a low pass filter circuit 330, a determination circuit 340, and a phase adjusting circuit 350. The comparator 310 compares the input signal S1 and the reference signal SR to generate the PWM signal SP1. The determination circuit 340 provides a control signal SC according to one of a phase of the PWM signal SP2 and a phase of the noise inversion signal S2. The phase adjusting circuit 350 is coupled to the determination circuit 340, the comparator 310, and the conversion circuit 320. The phase adjusting circuit 350 adjusts a phase of the PWM signal SP1 according to the control signal SC coming from the determination circuit 340, so as to generate a modulated signal SP1'. The conversion circuit 320 converts the PWM signal SP1 to the PWM signal SP2. The low pass filter circuit 330 performs a filtering operation on the PWM signal SP2 to generate the noise inversion signal S2.

The implementation manner of the comparator 310, the conversion circuit 320, and the low pass filter circuit 330 is sufficiently taught in the embodiments depicted in FIG. 2, FIG. 3, and FIG. 4 and thus will not be repeated hereinafter.

For instance, the determination circuit 340 determines whether the phase of the PWM signal SP2 is the same as the phase of the PWM signal SP1. If it is determined that the phase of the PWM signal SP2 and the phase of the PWM signal SP1 are approximately identical to each other, it indicates that the conversion circuit 320 does not convert the PWM signal SP1. The conversion circuit 320 may have an abnormality. Hence, the determination circuit 340 controls the phase adjusting circuit 350 through the control signal SC. The phase adjusting circuit 350 reacts to the control signal SC to perform an inversion operation on the PWM signal SP1 to generate the modulated signal SP1'. On the other hand, if it is determined that the phase of the PWM signal SP2 and the phase of the PWM signal SP1 are opposite to each other, the determination circuit 340 controls the phase adjusting circuit 350 through the control signal SC. The phase adjusting circuit 350 reacts to the control signal SC to transmit the PWM signal SP1. In other words, the determination circuit 340 enables the phase adjusting circuit 350 to provide one of the PWM signal SP1 and the modulated signal SP1' based on the phase of the PWM signal SP2.

To be specific, if it is determined that the phase of the PWM signal SP2 and the phase of the PWM signal SP1 are approximately identical to each other, the determination circuit 340 generates the control signal SC having a first voltage value. The phase adjusting circuit 350 reacts to the control signal SC having the first voltage value to generate the modulated signal SP1'. On the other hand, if it is determined that the phase of the PWM signal SP2 and the phase of the PWM signal SP1 are opposite to each other, the determination circuit 340 generates the control signal SC having a second voltage value. The phase adjusting circuit 350 reacts to the control signal SC having the second voltage value to transmit the PWM signal SP1.

In this embodiment, the determination circuit 340 may also receive the noise inversion signal S2 and the input signal S1 transmitted to a backend circuit (e.g., the synthesized circuit STC shown in FIG. 1). It is determined whether the phase of the noise inversion signal S2 is the same as the phase of the input signal S1. If it is determined that the phase of the noise inversion signal S2 and the phase of the input signal S1 are identical, it indicates that the conversion circuit 320 does not convert the PWM signal SP1. The conversion circuit 320 may have an abnormality, or an unexpected time delay may occur in the input signal S1 transmitted to the backend circuit. The determination circuit 340 controls the phase adjusting circuit 350 through the control signal SC to perform an inversion operation on the PWM signal SP1. If it is determined that the phase of the noise inversion signal S2 and the phase of the input signal S1 are opposite to each other, the determination circuit 340 controls the phase adjusting circuit 350 through the control signal SC to transmit the PWM signal SP1.

In this embodiment, the determination circuit 340 is, for instance, a central processing unit (CPU) or any other programmable general-purpose or special-purpose micro-processor, digital signal processor (DSP), programmable controller, application specific integrated circuit (ASIC), programmable logic device (PLD), any other similar device, or a combination of these devices capable of loading and executing computer programs.

Figure 6:
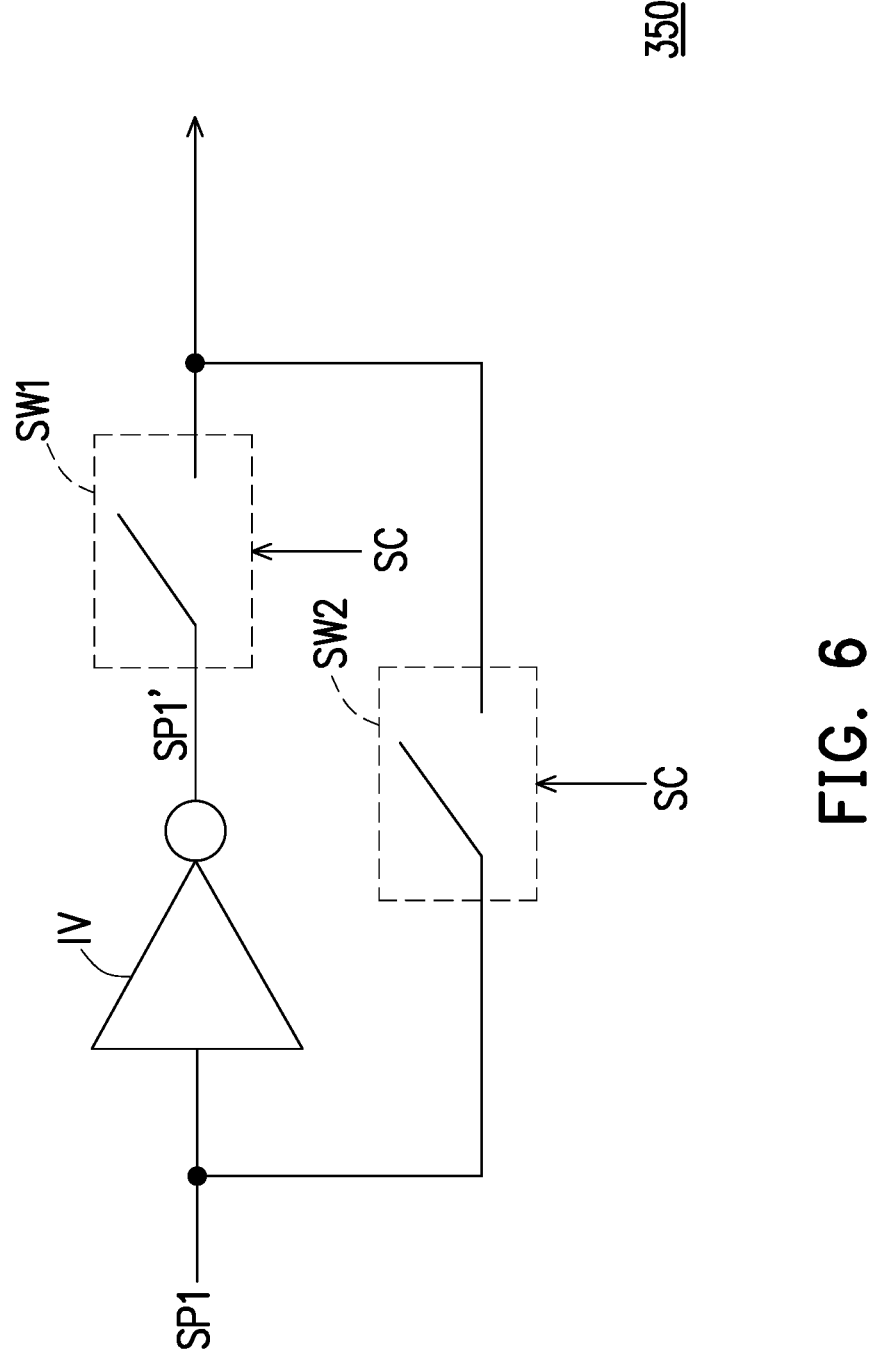
FIG. 6 is a schematic view of a phase adjusting circuit according to an embodiment of the disclosure.

Please refer to FIG. 5 and FIG. 6. FIG. 6 is a schematic view of a phase adjusting circuit according to an embodiment of the disclosure. In this embodiment, the phase adjusting circuit 350 includes an inverter IV and switches SW1 and SW2. An input terminal of the inverter IV receives the PWM signal SP1. A first terminal of the switch SW1 is coupled to an output terminal of the inverter IV. A second terminal of the switch SW1 is coupled to the conversion circuit 320. A control terminal of the switch SW1 receives the control signal SC. A first terminal of the switch SW2 receives the PWM signal SP1. A second terminal of the switch SW2 is coupled to the conversion circuit 320. A control terminal of the switch SW2 receives the control signal SC.

In this embodiment, the phase adjusting circuit 350 reacts to the control signal SC to turn on one of the switches SW1 and SW2. When the switch SW1 is turned on, the switch SW2 is turned off. Hence, the inverter IV converts the PWM signal SP1 to the modulated signal SP1'. In this embodiment, the modulated signal SP1' is the inverted signal of the PWM signal SP1 (i.e., the inverted PWM signal). On the other hand, when the switch SW2 is turned on, the switch SW1 is turned off. Hence, the phase adjusting circuit 350 transmits the PWM signal SP1.

Figure 7:
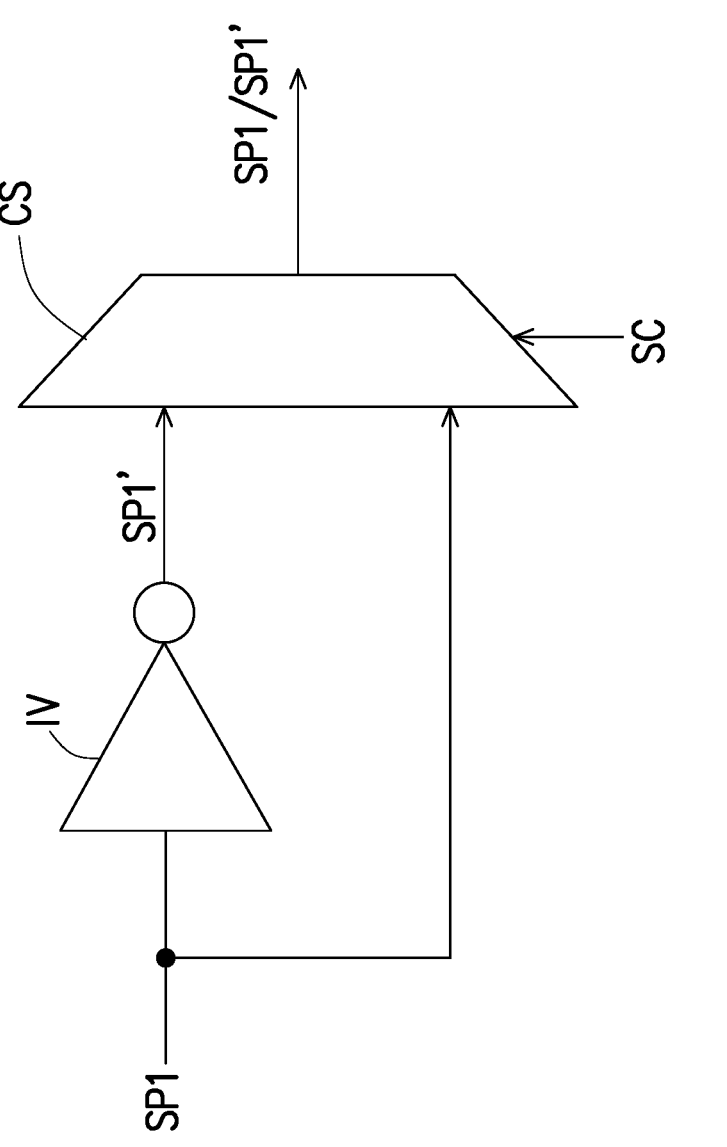
FIG. 7 is a schematic view of a phase adjusting circuit according to an embodiment of the disclosure.

Please refer to FIG. 5 and FIG. FIG. 7 is a schematic view of a phase adjusting circuit according to an embodiment of the disclosure. In this embodiment, a phase adjusting circuit 350' includes the inverter IV and a selection circuit CS. The input terminal of the inverter IV receives the PWM signal SP1. The output terminal of the inverter IV outputs the modulated signal SP1'. In this embodiment, the modulated signal SP1' is the inverted signal of the PWM signal SP1 (i.e., the inverted PWM signal). A first input terminal of the selection circuit CS is coupled to the output terminal of the inverter IV. A second input terminal of the selection circuit CS receives the PWM signal SP1. The selection circuit reacts to the control signal SC to provide one of the PWM signal SP1 and the modulated signal SP1' to the conversion circuit 320.

In this embodiment, the selection circuit CS may be implemented in form of a multiplexer (MUX). If it is determined that the phase of the PWM signal SP2 and the phase of the PWM signal SP1 are approximately identical to each other, the determination circuit 340 generates the control signal SC having the first voltage value. The selection circuit CS reacts to the control signal SC having the first voltage value to generate the modulated signal SP1'. On the other hand, if it is determined that the phase of the PWM signal SP2 and the phase of the PWM signal SP1 are opposite to each other, the determination circuit 340 generates the control signal SC having the second voltage value. The selection circuit CS reacts to the control signal SC having the second voltage value to transmit the PWM signal SP1.

With reference to the embodiment depicted in FIG. 1, in this embodiment, the determination circuit 340 may further obtain a phase difference between the phase of the noise inversion signal S2 and the phase of the input signal S1 transmitted to the backend circuit (e.g., the synthesized circuit STC shown in FIG. 1). The determination circuit 340 provides the control signal SC according to the phase difference. The determination circuit 340 controls the phase adjusting circuit 350 through the control signal SC to adjust the phase of the PWM signal SP1.

The phase adjusting circuit 350 may adjust the lead or delay of the phase of the PWM signal SP1. For instance, a range of the phase difference (e.g.,) 180°±5° may be set. If the determination circuit 340 determines that the phase difference exceeds the range of the phase difference, it indicates that the input signal S1 transmitted to the backend circuit encounters an unexpected phase lead or phase delay. The phase lead or phase delay of the input signal S1 transmitted to the backend circuit deteriorates the noise reduction effect. Hence, the determination circuit 340 provides the control signal SC according to the phase difference. The phase adjusting circuit 350 reacts to the control signal SC to adjust the phase of the PWM signal SP1. In particular, for instance, the control signal SC may include a code value or a voltage value corresponding to the phase difference. The phase adjusting circuit 350 reacts to the code value or the voltage value corresponding to the phase difference to adjust the phase of the PWM signal SP1.

In light of the foregoing, the noise reduction signal generator 300 adjusts the phase of the PWM signal SP1 to enhance the effect of the active noise reduction mechanism.

Figure 8:
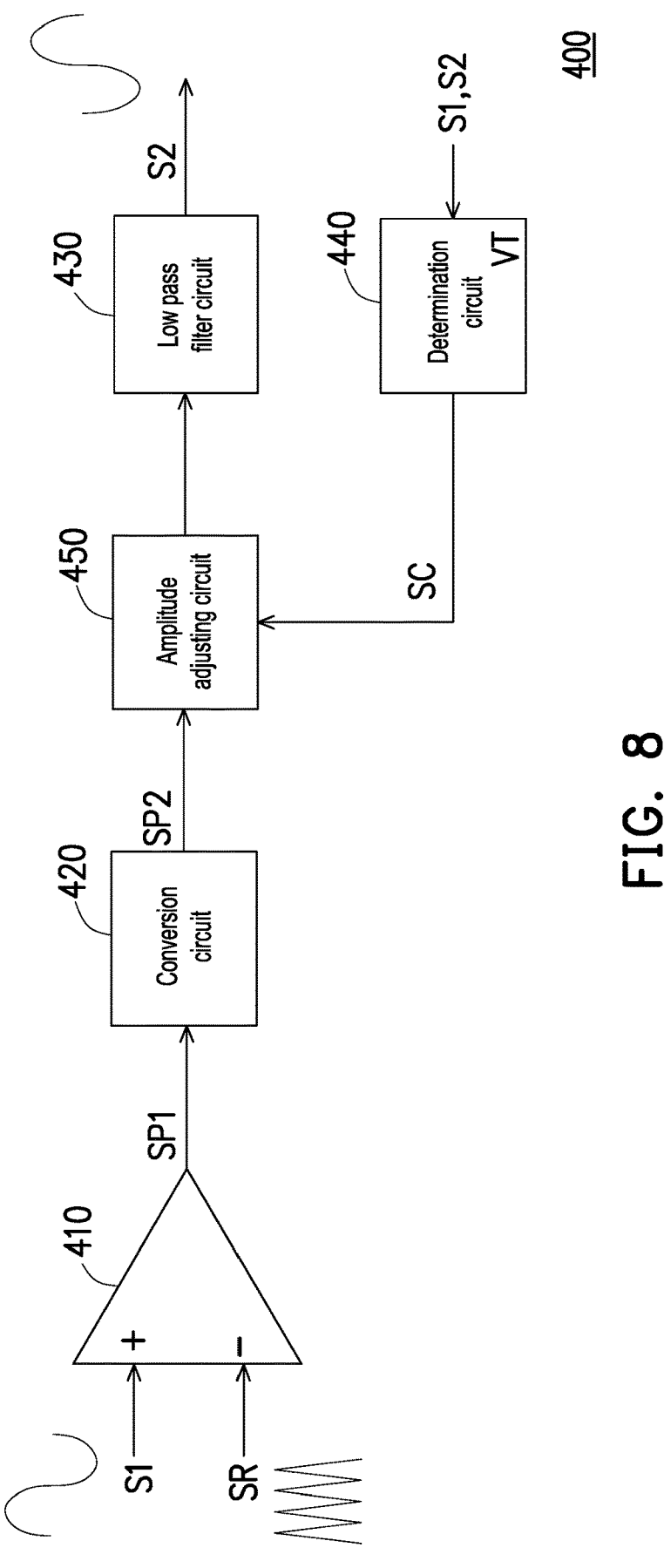
FIG. 8 is a schematic view of a noise reduction signal generator according to a third embodiment of the disclosure.

Please refer to FIG. 8. FIG. 8 is a schematic view of a noise reduction signal generator according to a third embodiment of the disclosure. In this embodiment, a noise reduction signal generator 400 includes a comparator 410, a conversion circuit 420, a low pass filter circuit 430, a determination circuit 440, and an amplitude adjusting circuit 450. The comparator 410 compares the input signal S1 and the reference signal SR to generate the PWM signal SP1. The conversion circuit 420 converts the PWM signal SP1 to the PWM signal SP2. The determination circuit 440 provides the control signal SC according to an amplitude of the input signal S1 and an amplitude of the noise inversion signal S2. The amplitude adjusting circuit 450 is coupled to the determination circuit 440, the conversion circuit 420, and the low pass filter circuit 430. The amplitude adjusting circuit 450 adjusts an amplitude of the PWM signal SP2 according to the control signal SC. The low pass filter circuit 430 performs a filtering operation on the PWM signal SP2 to generate the noise inversion signal S2.

In this embodiment, the determination circuit 40 determines whether an amplitude difference between the amplitude of the input signal S1 and the amplitude of the noise inversion signal S2 is greater than a valve value VT. If the amplitude difference is greater than the valve value VT, it indicates that there is a significant difference between the amplitude of the input signal S1 and the amplitude of the noise inversion signal S2. The above difference reduces the effect of noise reduction. Hence, the determination circuit 440 controls the amplitude adjusting circuit 450 through the control signal SC to adjust the amplitude of the PWM signal SP2. On the other hand, if the difference is smaller than the valve value VT, it indicates that the amplitude difference between the amplitude of the input signal S1 and the amplitude of the noise inversion signal S2 is relatively insignificant. Hence, the determination circuit 440 controls the amplitude adjusting circuit 450 through the control signal SC to keep the amplitude of the PWM signal SP2.

For instance, the input signal S1 is the noise source in the signal SAU. The amplitude (or the high voltage value) of the PWM signal SP2 is positively correlated to the amplitude of the noise inversion signal S2. The determination circuit 440 receives the input signal S1 and the noise inversion signal S2. The determination circuit 440 subtracts the amplitude of the input signal S1 from the amplitude of the noise inversion signal S2 to obtain the amplitude difference. If the amplitude difference is greater than the valve value VT, it indicates that the amplitude of the noise inversion signal S2 is relatively significant. Hence, the determination circuit 440 controls the amplitude adjusting circuit 450 to reduce the amplitude of the PWM signal SP2, thereby reducing the amplitude of the noise inversion signal S2. If the amplitude difference is smaller than the valve value VT, it indicates that the amplitude of the noise inversion signal S2 is relatively insignificant. Hence, the determination circuit 440 controls the amplitude adjusting circuit 450 to increase the amplitude of the PWM signal SP2, thereby increasing the amplitude of the noise inversion signal S2. If the amplitude difference is substantially equal to the valve value VT, it indicates that the noise inversion signal S2 may offset the input signal S1. Hence, the determination circuit 440 controls the amplitude adjusting circuit 450 to keep the current amplitude of the PWM signal SP2.

In light of the above, the noise reduction signal generator 400 adjusts the amplitude of the PWM signal SP2 to improve the effect of the active noise reduction mechanism.

In some embodiments, the amplitude adjusting circuit 450 may be implemented in form of at least one of a level shifter, a voltage dividing circuit, and a voltage modulating circuit.

In some embodiments, the amplitude adjusting circuit 450 may be disposed in one of the conversion circuit 420 and the low pass filter circuit 430.

To sum up, the noise reduction signal generator provided in one or more embodiments of the disclosure generates the noise inversion signal according to the input signal. The noise inversion signal is configured to reduce the noise of the input signal. Thereby, as long as the input signal is received, the noise reduction signal generator actively generates the noise inversion signal to reduce the noise in the input signal. Namely, the noise reduction signal generator described in one or more embodiments of the disclosure provides the active noise reduction mechanism. In addition, the noise reduction signal generator provided in one or more embodiments of the disclosure adjusts the phase of the first PWM signal and/or the amplitude of the second PWM signal SP2, thereby improving the effect of the active noise reduction mechanism.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A noise reduction signal generator, comprising:

a comparator, configured to receive an input signal and a reference signal and generate a first pulse width modulation signal by comparing the input signal and the reference signal, wherein a pulse width of the first pulse width modulation signal is correlated to a comparison result of a signal intensity of the input signal and a signal intensity of the reference signal;

a conversion circuit, coupled to the comparator and configured to convert the first pulse width modulation signal to a second pulse width modulation signal, wherein a phase of the second pulse width modulation signal is different from a phase of the first pulse width modulation signal;

a low pass filter circuit, coupled to the conversion circuit and configured to perform a filtering operation on the second pulse width modulation signal to generate a noise inversion signal, wherein the noise inversion signal is configured to reduce noise of the input signal;

a determination circuit, configured to provide a control signal according to one of the phase of the second pulse width modulation signal and a phase of the noise inversion signal; and a phase adjusting circuit, coupled to the determination circuit, the comparator, and the conversion circuit and configured to adjust the phase of the first pulse width modulation signal according to the control signal.

2. The noise reduction signal generator according to claim 1, wherein:

the comparator has a non-inverted input terminal, an inverted input terminal, and an output terminal, the non-inverted input terminal receives the input signal, the inverted input terminal receives the reference signal, and the output terminal is configured to output the first pulse width modulation signal.

3. The noise reduction signal generator according to claim 1, wherein:

the determination circuit determines whether the phase of the second pulse width modulation signal is identical to the phase of the first pulse width modulation signal, when the phase of the second pulse width modulation signal is identical to the phase of the first pulse width modulation signal, the determination circuit controls the phase adjusting circuit through the control signal to perform an inversion operation on the first pulse width modulation signal, and when the phase of the second pulse width modulation signal and the phase of the first pulse width modulation signal are opposite to each other, the determination circuit controls the phase adjusting circuit through the control signal to transmit the first pulse width modulation signal.

4. The noise reduction signal generator according to claim 1, wherein:

the determination circuit determines whether the phase of the noise inversion signal is identical to a phase of the input signal, when the phase of the noise inversion signal is identical to the phase of the input signal, the determination circuit controls the phase adjusting circuit through the control signal to perform an inversion operation on the first pulse width modulation signal, and when the phase of the noise inversion signal and the phase of the input signal are opposite to each other, the determination circuit controls the phase adjusting circuit through the control signal to transmit the first pulse width modulation signal.

5. The noise reduction signal generator according to claim 1, wherein the phase adjusting circuit comprises:

an inverter, wherein an input terminal of the inverter receives the first pulse width modulation signal;

a first switch, wherein a first terminal of the first switch is coupled to an output terminal of the inverter, a second terminal of the first switch is coupled to the conversion circuit, and a control terminal of the first switch receives the control signal; and a second switch, wherein a first terminal of the second switch receives the first pulse width modulation signal, a second terminal of the second switch is coupled to the conversion circuit, and a control terminal of the second switch receives the control signal, wherein when the first switch is turned on, the second switch is turned off, and when the second switch is turned on, the first switch is turned off.

6. The noise reduction signal generator according to claim 1, wherein the phase adjusting circuit comprises:

an inverter, wherein an input terminal of the inverter receives the first pulse width modulation signal, and an output terminal of the inverter is configured to output the inverted first pulse width modulation signal; and a selection circuit, wherein a first input terminal of the selection circuit is coupled to the output terminal of the inverter, a second input terminal of the selection circuit receives the first pulse width modulation signal, and the selection circuit is configured to react to the control signal to provide one of the first pulse width modulation signal and the inverted first pulse width modulation signal to the conversion circuit.

7. The noise reduction signal generator according to claim 1, wherein the determination circuit obtains a phase difference between the phase of the noise inversion signal and the phase of the input signal and controls the phase adjusting circuit through the control signal to adjust the phase of the first pulse width modulation signal according to the phase difference.

8. The noise reduction signal generator according to claim 1, further comprising:

a determination circuit, configured to provide a control signal according to an amplitude of the input signal and an amplitude of the noise inversion signal; and an amplitude adjusting circuit, coupled to the determination circuit, the conversion circuit, and the low pass filter circuit and configured to adjust an amplitude of the second pulse width modulation signal according to the control signal.

9. The noise reduction signal generator according to claim 8, wherein:

the determination circuit determines whether an amplitude difference between the amplitude of the input signal and the amplitude of the noise inversion signal is greater than a valve value, and when the amplitude difference is greater than the valve value, the determination circuit controls the amplitude adjusting circuit through the control signal to adjust the amplitude of the second pulse width modulation signal.

* * * * *